US010389229B2

(12) United States Patent
Tsunoda

(10) Patent No.: US 10,389,229 B2
(45) Date of Patent: Aug. 20, 2019

(54) POWER MODULE

(71) Applicant: Mitsubishi Electric Corporation, Tokyo (JP)

(72) Inventor: Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 369 days.

(21) Appl. No.: 15/298,719

(22) Filed: Oct. 20, 2016

(65) Prior Publication Data

US 2017/0237335 A1 Aug. 17, 2017

(30) Foreign Application Priority Data

Feb. 12, 2016 (JP) .................... 2016-024419

(51) Int. Cl.
*H02H 9/00* (2006.01)
*H02M 1/34* (2007.01)
(Continued)

(52) U.S. Cl.
CPC ........ *H02M 1/34* (2013.01); *H01L 23/49589* (2013.01); *H01L 23/49844* (2013.01); *H01L 23/49861* (2013.01); *H01L 25/072* (2013.01); *H01L 25/18* (2013.01); *H02H 3/20* (2013.01); *H02M 7/003* (2013.01); *H02M 2001/346* (2013.01); *H02M 2001/348* (2013.01); *Y02B 70/1491* (2013.01)

(58) Field of Classification Search
CPC ....................................................... H02M 1/34
See application file for complete search history.

(56) References Cited

U.S. PATENT DOCUMENTS 5,543,659 A * 8/1996 Hosen .................... H01L 25/18
257/678
6,282,077 B1 8/2001 Kijima
(Continued)

FOREIGN PATENT DOCUMENTS

CN  1244021 A  2/2000
CN  101965677 A  2/2011
(Continued)

OTHER PUBLICATIONS

An Office Action mailed by the State Intellectual Property Office of the People's Republic of China dated Sep. 4, 2018, which corresponds to Chinese Patent Application No. 201710078604.1 and is related to U.S. Appl. No. 15/298,719; with English translation.
(Continued)

*Primary Examiner* — Stephen W Jackson
(74) *Attorney, Agent, or Firm* — Studebaker & Brackett PC

(57) ABSTRACT

It is an object to provide a technique where a snubber capacitor having an appropriate capacitance is usable. A power module includes: a third lead having one end electrically connected to a first connection point and the other end exposed from a package, where the third lead is shorter than a first lead; and a fourth lead having one end electrically connected to a second connection point and the other end exposed from the package, where the fourth lead is shorter than a second lead. A snubber capacitor is attachable to and detachable from the other ends of the third lead and fourth lead.

11 Claims, 10 Drawing Sheets

(51) Int. Cl.
*H01L 23/495* (2006.01)
*H01L 23/498* (2006.01)
*H01L 25/07* (2006.01)
*H01L 25/18* (2006.01)
*H02H 3/20* (2006.01)
*H02M 7/00* (2006.01)

(56) References Cited

U.S. PATENT DOCUMENTS

| | | | |
|---|---|---|---|
| 6,525,950 | B1 | 2/2003 | Shirakawa et al. |
| 8,824,177 | B2 * | 9/2014 | Godo ............... H01L 23/49575 363/56.12 |
| 9,570,972 | B2 * | 2/2017 | Kanda ..................... H02M 1/34 |
| 9,704,831 | B2 * | 7/2017 | Hatai ................ H01L 23/49805 |
| 10,079,552 | B2 * | 9/2018 | Kadota ................. H02M 7/003 |
| 2002/0196609 | A1 | 12/2002 | Golightly et al. |
| 2010/0328975 | A1 | 12/2010 | Hibino et al. |
| 2011/0181993 | A1 | 7/2011 | Yamaguchi |
| 2013/0277820 | A1 | 10/2013 | Hotta et al. |
| 2015/0023081 | A1 | 1/2015 | Obiraki et al. |
| 2016/0172995 | A1 | 6/2016 | Obiraki et al. |

FOREIGN PATENT DOCUMENTS

| | | |
|---|---|---|
| DE | 102011076324 A1 | 11/2012 |
| DE | 112011103941 T5 | 8/2013 |
| JP | H03-068386 U | 7/1991 |
| JP | H07-122708 A | 5/1995 |
| JP | H08-033346 A | 2/1996 |
| JP | 2001-144248 A | 5/2001 |
| JP | 2001-286158 A | 10/2001 |
| JP | 2005-094882 A | 4/2005 |
| JP | 2007-143336 A | 6/2007 |
| JP | 2009-225612 A | 10/2009 |
| JP | 2014-225706 A | 12/2014 |

OTHER PUBLICATIONS

An Office Action mailed by the German Patent and Trademark Office dated Sep. 18, 2018, which corresponds to German Patent Application No. 10 2017 200 440.1 and is related to U.S. Appl. No. 15/298,719.

An Office Action mailed by the Japanese Patent Office dated Mar. 26, 2019, which corresponds to Japanese Patent Application No. 2016-024419 and is related to U.S. Patent Application No. 15/298,719.

* cited by examiner

POWER MODULE

BACKGROUND OF THE INVENTION

Field of the Invention

The present invention relates to power modules including packages.

Description of the Background Art

Proposed are various techniques concerning power modules capable of switching a large current quickly. One example of such techniques includes a power module including an embedded capacitor, as proposed in Japanese Patent Application Laid-Open No. 2009-225612. In such a configuration, a snubber capacitor for reducing or eliminating surge voltage is connected to be adjacent to semiconductor switching elements (upper arms and lower arms) of individual sets. This enables the surge voltage to be reduced properly.

However, since the surge voltage varies depending on conditions of user's use of the module, the capacitance of the snubber capacitor needs to be optimized for each of the conditions of user's use in order to sufficiently reduce the surge voltage. Further, since capacitors are likely to have varied capacitances depending on a temperature change, the capacitor within the module is likely to have varied capacitances under the influence of heat generation of chips. This is particularly seen in a capacitor that uses a material having a high dielectric-constant (high dielectric) because the capacitance of such a capacitor is greatly subject to change depending on the temperature change. Thus, the capacitor cannot continue to have an appropriate capacitance enough to reduce the surge voltage. Unfortunately, this can cause the surge voltage to increase to the extent that the surge voltage exceeds element breakdown voltage.

To solve this problem, a capacitor having a large capacitance may be embedded in the module beforehand in light of the variations in capacitance of the capacitor. In such a case, however, a larger space than is required needs to be allocated within the module. This additionally results in a higher cost than is required and a larger apparatus than is required.

Furthermore, the high dielectric used for the capacitor is a sintered body; and it is difficult to sinter the dielectric of the capacitor together with a lead at high temperature. Hence, it is not possible to use a snubber capacitor having an appropriate capacitance enough to reduce the surge voltage. Unfortunately, this possibly causes the surge voltage to exceed the element breakdown voltage.

SUMMARY OF THE INVENTION

The present invention has been made in view of these problems. It is an object of the present invention to provide a technique where a snubber capacitor having an appropriate capacitance is usable.

A power module according to an aspect of the present invention includes a package, a power element, a positive terminal, a negative terminal, a third lead shorter than a first lead, and a fourth lead shorter than a second lead. The power element is disposed within the package. The power element includes a plurality of semiconductor switching elements constituting an upper arm and a lower arm between a first connection point and a second connection point. The positive terminal is configured to guide the first connection point of the power element outside the package through the first lead. The negative terminal is configured to guide the second connection point of the power element outside the package through the second lead. The third lead has a first end electrically connected to the first connection point, and a second end exposed from the package. The fourth lead has a first end electrically connected to the second connection point, and a second end exposed from the package. A snubber capacitor is attachable to and detachable from the second ends of the third lead and fourth lead.

The snubber capacitor having the appropriate capacitance is usable.

These and other objects, features, aspects and advantages of the present invention will become more apparent from the following detailed description of the present invention when taken in conjunction with the accompanying drawings.

DESCRIPTION OF THE PREFERRED EMBODIMENTS

The following describes preferred embodiments with reference to the accompanied drawings. The drawings are schematic. Thus, the relationships between the sizes and positions of components individually illustrated in different drawings are not necessarily illustrated with accuracy and can be changed as appropriate.

<Related Power Module>

Initially described below is a power module that relates to power modules according to the preferred embodiments (hereinafter referred to as a related power module), prior to a description about the power modules according to the preferred embodiments of the present invention.

Figure 1:
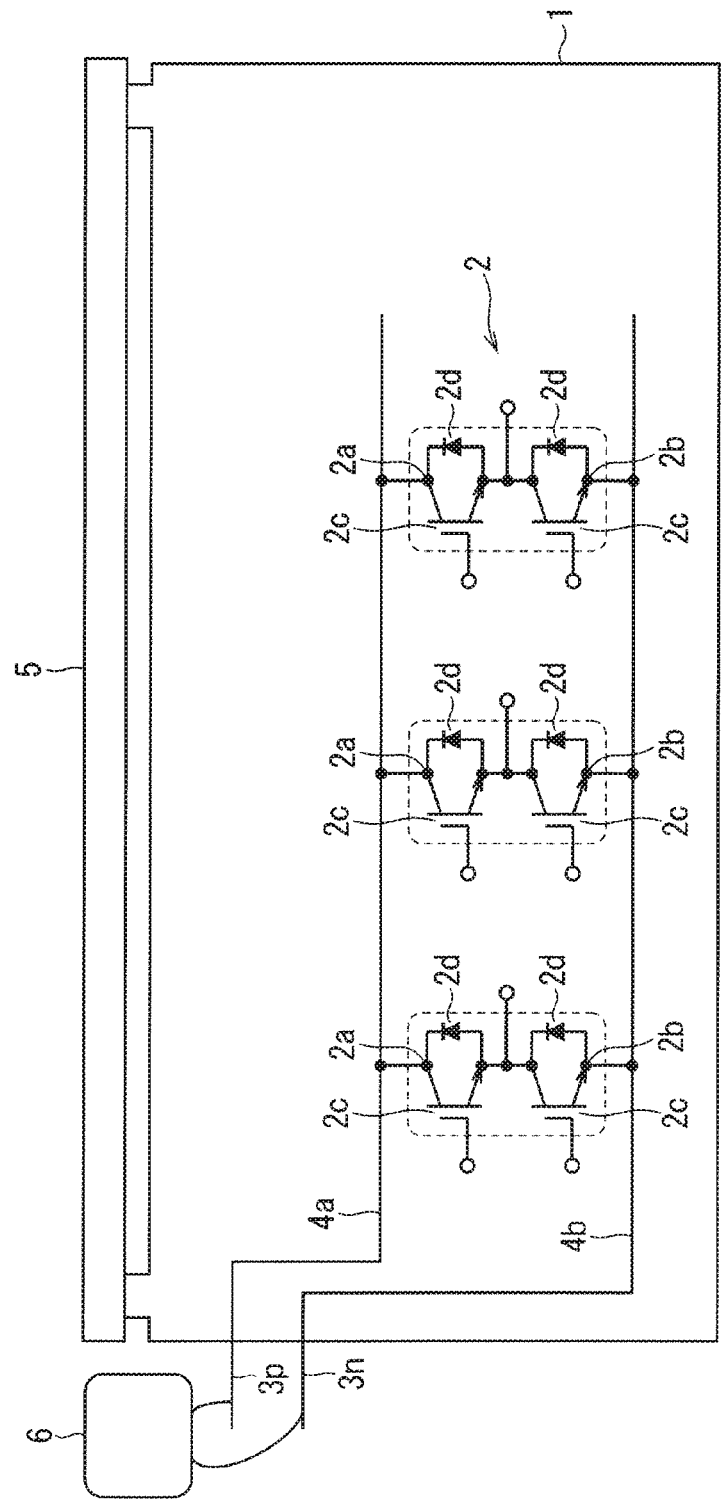
FIG. 1 is a cross-sectional view illustrating a configuration of a related power module.

FIG. 1 is a cross-sectional view illustrating a configuration of the related power module. In FIG. 1, the related power module includes a package 1, a power element 2, a positive terminal 3p, a negative terminal 3n, a first lead 4a, a second lead 4b, a printed circuit board 5, and a snubber capacitor 6.

The power element 2 is disposed within the package 1. Although not illustrated, the package 1 may include other components and circuits as well.

In FIG. 1, the power element 2 includes: a plurality of semiconductor switching elements 2c that constitute an upper arm and a lower arm between a first connection point 2a and a second connection point 2b; and a plurality of diodes 2d connected to the respective semiconductor switching elements 2c in parallel. In the example of FIG. 1, an emitter of the semiconductor switching element 2c in the upper arm is connected to a collector of the semiconductor switching element 2c in the lower arm. Moreover, a collector of the semiconductor switching element 2c in the upper arm is connected to the first connection point 2a. Moreover, an emitter of the semiconductor switching element 2c in the lower arm is connected to the second connection point 2b.

The related power module is configured such that the upper arm and the lower arm, which include the plurality of semiconductor switching elements 2c, are provided for individual phases. In the example of FIG. 1, the power element 2 is a three-phase-motor driving power element that includes semiconductor switching elements 2c of six circuits (three upper arms and three lower arms). The power element 2 has a positive potential and a negative potential that are common to the three upper arms and to the three lower arms.

It is noted that the semiconductor switching elements 2c each may include an insulated gate bipolar transistor (IGBT) or a metal oxide semiconductor field effect transistor (MOSFET). The diodes 2d each may include a Schottky barrier diode (SBD) or a PN diode. The power element 2 may be made of silicon (Si), or may include a wide handgap semiconductor made of a material, such as silicon carbide (SiC), gallium nitride (GaN), or diamond. The related power module with such a configuration is capable of stably operating under high temperature, and has a higher switching speed.

The positive terminal 3p guides the first connection points 2a (positive potential) of the power element 2 outside the package 1 through the first lead 4a. The negative terminal 3n guides the second connection points 2b (negative potential) of the power element 2 outside the package 1 through the second lead 4b. It is noted that the positive terminal 3p may be used as one end of the first lead 4a, and the negative terminal 3n may be used as one end of the second lead 4b, as illustrated in FIG. 1.

The printed circuit board 5 includes circuits (not illustrated), such as a control circuit, a driving circuit, and a protective circuit. Although not illustrated, the circuit on the printed circuit board 5 may be electrically connected to a component, such as the power element 2.

The snubber capacitor 6 is capable of reducing or eliminating surge voltage of the power element 2. Here, in the related power module, the snubber capacitor 6 is securely connected to the positive terminal 3p and the negative terminal 3n. The related power module is configured such that some of the arms are located away from the positive terminal 3p and the negative terminal 3n, and thus have a large distance to the snubber capacitor 6. Such a configuration prevents the snubber capacitor 6 from sufficiently reducing the surge voltage. To reduce the surge voltage, proposed is a power module including an embedded snubber capacitor (for instance, Japanese Patent Application Laid-Open No. 2009-225612).

However, since capacitors are likely to have varied capacitances depending on a temperature change, the snubber capacitor within the power module is likely to have varied capacitances under the influence of heat generation of chips. Thus, the snubber capacitor does not continue to have an appropriate capacitance enough to reduce the surge voltage. Unfortunately, this possibly causes the surge voltage to increase to the extent that the surge voltage exceeds element breakdown voltage. In contrast to this, power modules described below, according to first to ninth preferred embodiments of the present invention solve such a problem.

First Preferred Embodiment

Figure 2:
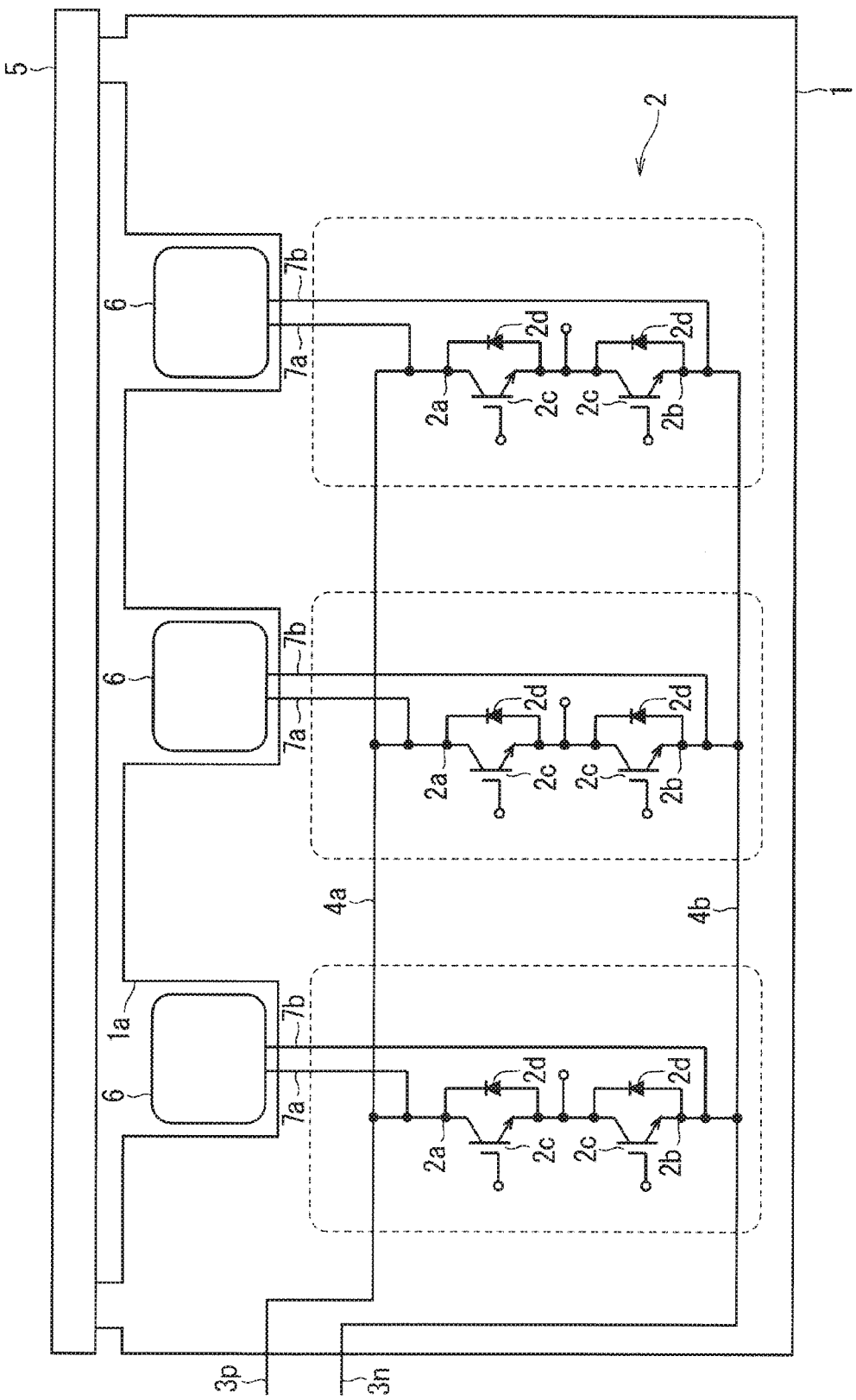
FIG. 2 is a cross-sectional view illustrating a configuration of a power module according to a first preferred embodiment.

FIG. 2 is a cross-sectional view illustrating a configuration of a power module according to a first preferred embodiment. Among components described in the first preferred embodiment, components that are the same as or similar to those of the related power module are denoted by the same reference signs. The following mainly describes different components than those of the related power module.

Like the related power module, the power module in FIG. 2 includes a package 1, a power element 2, a positive terminal 3p, a negative terminal 3n, a first lead 4a, a second lead 4b, and a printed circuit board 5.

Like the related power module, the power element 2 in FIG. 2 includes a plurality of semiconductor switching elements 2c and a plurality of diodes 2d. The plurality of semiconductor switching elements 2c constitute an upper arm and a lower arm. The upper arm and the lower arm are provided for individual phases. Further, the positive terminal 3p guides first connection points 2a (positive potential) of the power element 2 outside the package 1 through the first lead 4a. The negative terminal 3n guides second connection points 2b (negative potential) of the power element 2 outside the package 1 through the second lead 4b.

Here, the power module in FIG. 2 includes third leads 7a and fourth leads 7b used for connection, in addition to the earlier-described components.

Each third lead 7a has one end electrically connected to the corresponding first connection point 2a, and the other end exposed from the package 1. Moreover, each third lead 7a is shorter than the first lead 4a. Likewise, each fourth lead 7b has one end electrically connected to the corresponding second connection point 2b, and the other end exposed from the package 1. Moreover, each fourth lead 7b is shorter than the second lead 4b. Moreover, each third lead 7a may be directly connected to the corresponding first connection point 2a in the one end of the third lead 7a, although FIG. 2 illustrates that the third lead 7a is not. Likewise, each fourth lead 7b may be directly connected to the corresponding second connection point 2b in the one end of the fourth lead 7b, although FIG. 2 illustrates that the fourth lead 7b is not.

In the first preferred embodiment, a corresponding snubber capacitor 6 is attachable to and detachable from the other ends of the third lead 7a and fourth lead 7b, where the other ends are exposed from the package 1. Examples of various attaching and detaching structures include a socket, which will be described in a ninth preferred embodiment, and a screw bolt, which is not illustrated.

The power module according to the first preferred embodiment is configured such that the third leads 7a and the fourth leads 7b are relatively short. Thus, the snubber capacitors 6 for reducing or eliminating the surge voltage are connected to be adjacent to the semiconductor switching elements 2c. This enables the surge voltage to be reduced properly. Further, the power module according to the first preferred embodiment is configured such that the snubber capacitors 6 are attachable to and detachable from the other ends of the third leads 7a and fourth leads 7b. Such a configuration enables the snubber capacitors 6 to be replaced with different snubber capacitors 6 having an appropriate capacitance and size. This enables the surge voltage to be reduced or eliminated properly, and also achieves a cost reduction and a small apparatus.

The power module according to the first preferred embodiment is configured such that the upper arm and the lower arm, which include the plurality of semiconductor switching 2c between the corresponding first connection point 2a and the corresponding second connection point 2b, are provided for the individual phases. Such a configuration enables the semiconductor switching elements 2c to be connected to the snubber capacitor 6 in each phase. Consequently, the surge voltage in each phase is reduced or eliminated.

In the first preferred embodiment, the package 1 has a surface provided with recesses 1a in which the snubber capacitors 6 are accommodated when the snubber capacitors 6 are attached to the other ends of the third leads 7a and fourth leads 7b, as illustrated in FIG. 2. Such a configuration enables the snubber capacitors 6 to be connected to be adjacent to the semiconductor switching elements 2c. Hence, the surge voltage is further reduced. Further, such a configuration enables the printed circuit board 5 to be disposed on the package 1 without the snubber capacitors 6 interfering.

Second Preferred Embodiment

Figure 3:
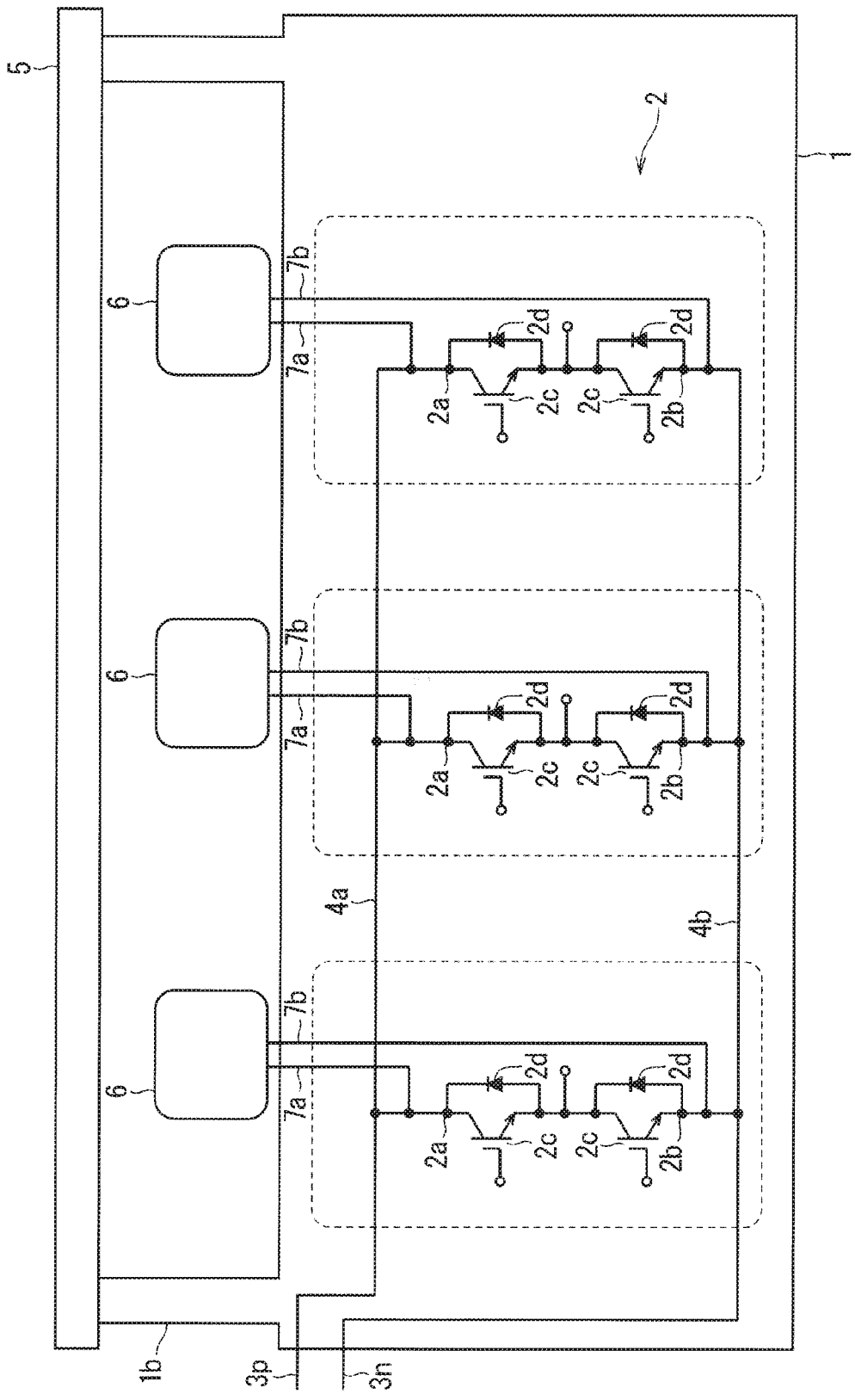
FIG. 3 is a cross-sectional view illustrating a configuration of a power module according to a second preferred embodiment.

FIG. 3 is a cross-sectional view illustrating a configuration of a power module according to a second preferred embodiment. Among components described in the second preferred embodiment, components that are the same as or similar to those of the power module in the first preferred embodiment are denoted by the same reference signs. The following mainly describes different components than those of the power module in the first preferred embodiment.

In the second preferred embodiment, the package 1 has a surface provided with protrusions 1b instead of the recesses 1a. Here, the protrusions 1b protrude in parallel with the snubber capacitors 6 when the snubber capacitors 6 are connected to the other ends of the third leads 7a and fourth leads 7b.

The power module according to the second preferred embodiment achieves the same advantages as those in the first preferred embodiment. In the second preferred embodiment, the protrusions 1b enable a standoff height to be kept at a desired height. Such a configuration enables the power module to have an inner space in which the snubber capacitors 6 are accommodated. Consequently, the snubber capacitors 6 are connected to be more adjacent to the semiconductor switching elements 2c. Hence, the surge voltage is further reduced. Further, such a configuration enables the printed circuit board 5 to be disposed on the package 1 without the snubber capacitors 6 interfering.

Third Preferred Embodiment

Figure 4:
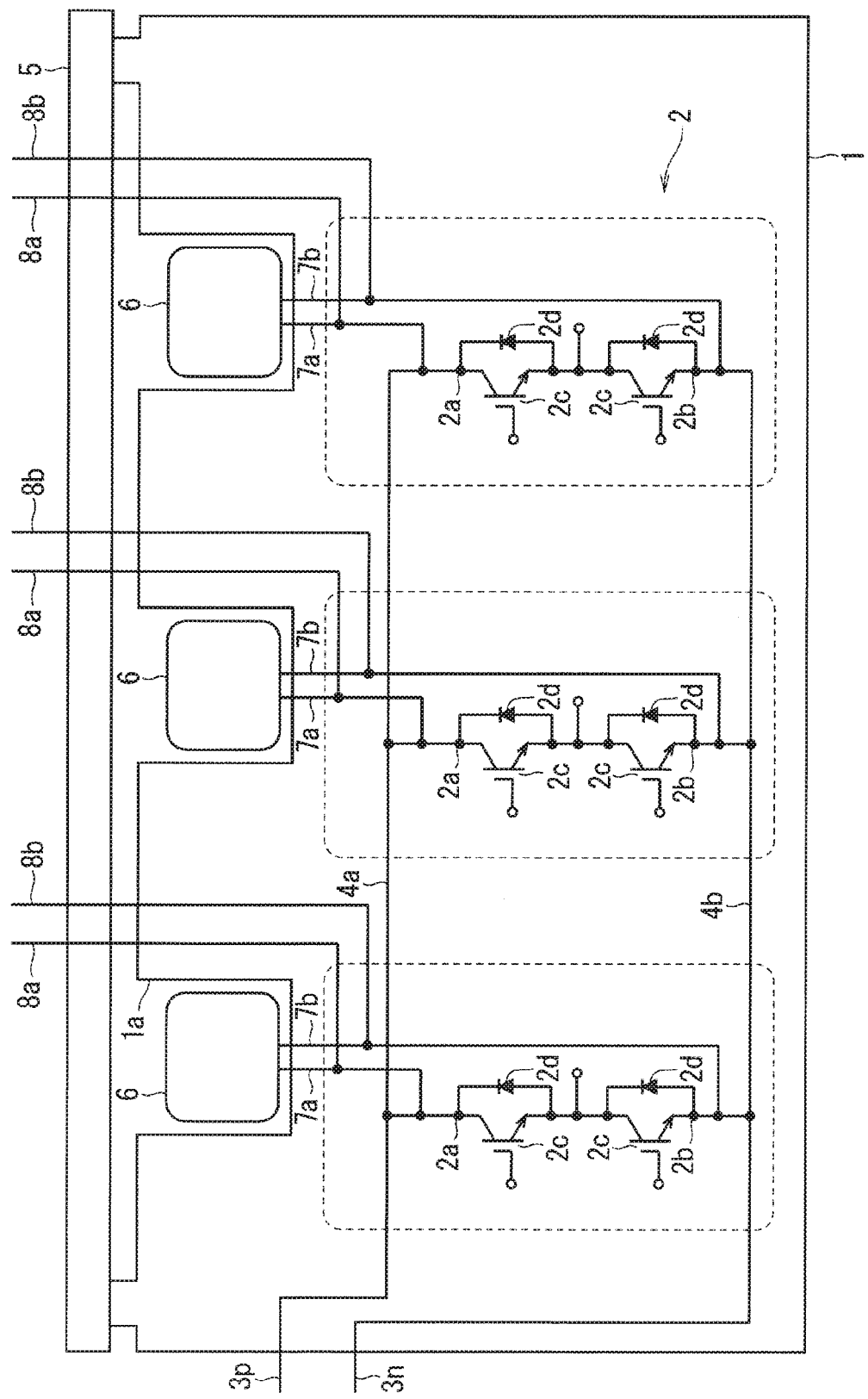
FIG. 4 is a cross-sectional view illustrating a configuration of a power module according to a third preferred embodiment.

FIG. 4 is a cross-sectional view illustrating a configuration of a power module according to a third preferred embodiment. Among components described in the third preferred embodiment, components that are the same as or similar to those of the power module in the first preferred embodiment are denoted by the same reference signs. The following mainly describes different components than those of the power module in the first preferred embodiment.

The power module according to the third preferred embodiment includes fifth leads 8a and sixth leads 8b for monitoring the surge voltage in addition to the components in the first preferred embodiment (FIG. 2).

Each fifth lead 8a has one end connected to the corresponding third lead 7a, and the other end exposed from the package 1. Likewise, each sixth lead 8b has one end connected to the corresponding fourth lead 7b, and the other end exposed from the package 1. Moreover, a monitoring apparatus capable of monitoring the surge voltage is attachable to and detachable from the other ends of the fifth lead 8a and six lead 8b, where the other ends are exposed from the package 1.

The power module according to the third preferred embodiment achieves the same advantages as those in the first preferred embodiment. Further, in the third preferred embodiment, the fifth leads 8a and the sixth leads 8b enable the surge voltage in the individual arms to be monitored. This facilitates checking whether the surge voltage in the individual arms is reduced for certain.

Fourth Preferred Embodiment

Figure 5:
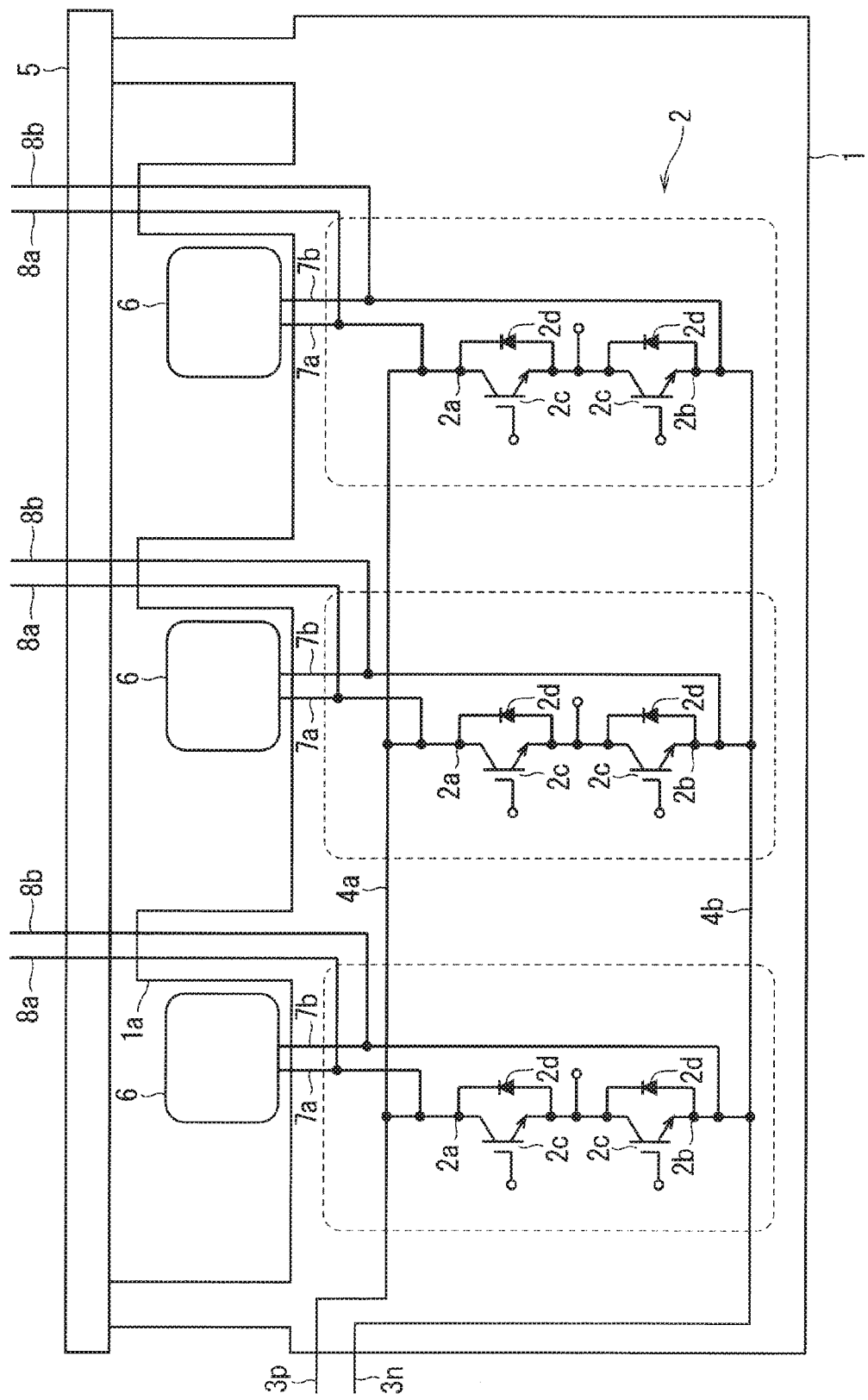
FIG. 5 is a cross-sectional view illustrating a configuration of a power module according to a fourth preferred embodiment.

FIG. 5 is a cross-sectional view illustrating a configuration of a power module according to a fourth preferred embodiment. Among components described in the fourth preferred embodiment, components that are the same as or similar to those of the power modules in the second and third preferred embodiments are denoted by the same reference signs. The following mainly describes different components than those of the power modules in the second and third preferred embodiments.

The power module according to the fourth preferred embodiment includes the fifth leads 8a and the sixth leads 8b (FIG. 4), which are the same as those in the third preferred embodiment, in addition to the components in the second preferred embodiment (FIG. 3).

The power module according to the fourth preferred embodiment achieves the same advantages as those in the second preferred embodiment. Further, in the fourth preferred embodiment, the fifth leads 8a and the sixth leads 8b enable the surge voltage in the individual arms to be monitored, like in the third preferred embodiment. This facilitates checking whether the surge voltage in the individual arms is reduced for certain.

Fifth Preferred Embodiment

Figure 6:
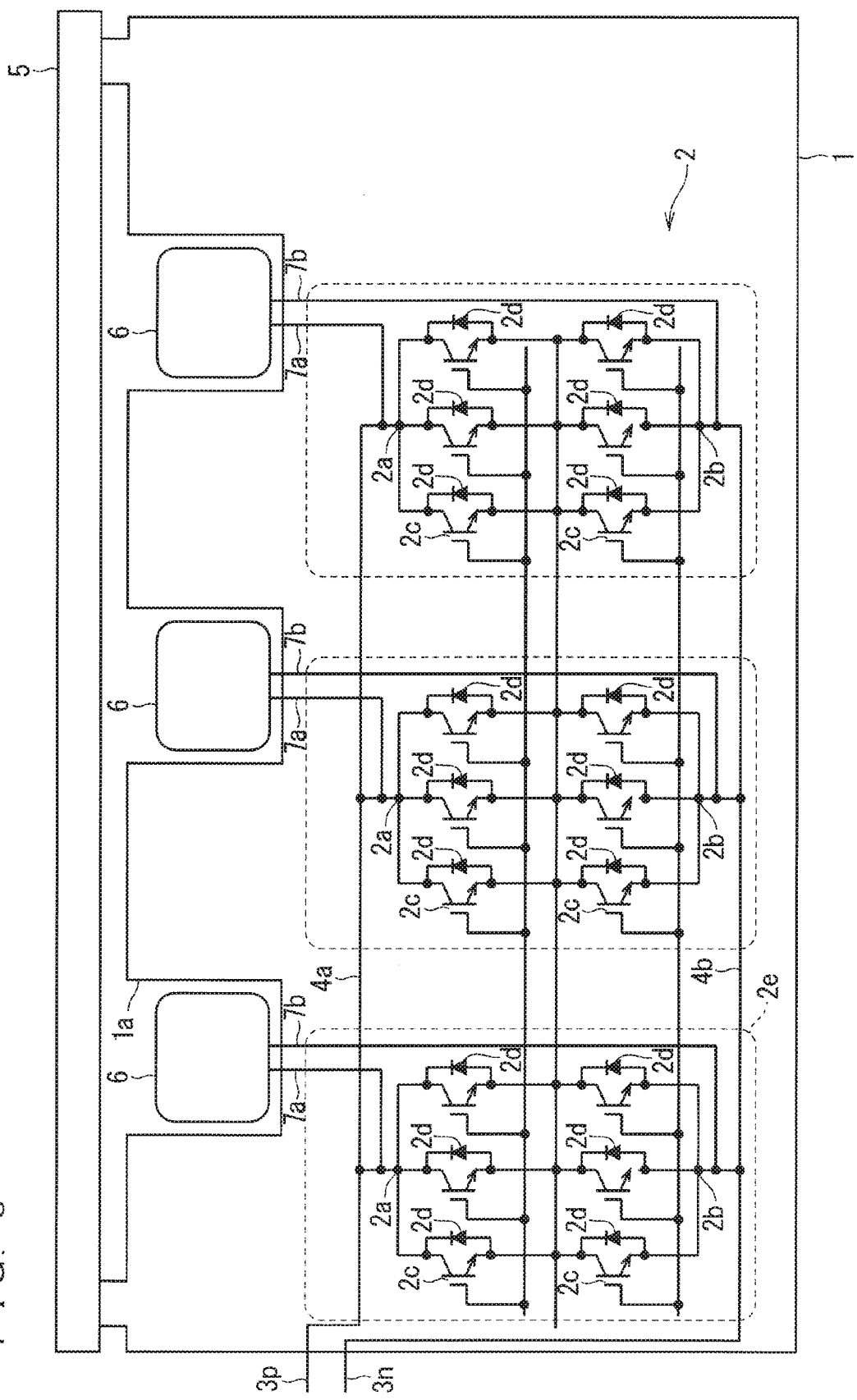
FIG. 6 is a cross-sectional view illustrating a configuration of a power module according to a fifth preferred embodiment.

FIG. 6 is a cross-sectional view illustrating a configuration of a power module according to a fifth preferred embodiment. Among components described in the fifth preferred embodiment, components that are the same as or similar to those of the power modules in the first preferred embodiment are denoted by the same reference signs. The following mainly describes different components than those of the power module in the first preferred embodiment.

Unlike the power element 2 according to the first preferred embodiment (FIG. 2), the power element 2 according to the fifth preferred embodiment includes semiconductor switching elements 2c of two circuits (one upper arm and one lower arm), where the power element 2 is adaptable to a large electric power. In the example of FIG. 6, the power element 2 includes three (a first group of) semiconductor switching elements 2c connected to each other in parallel and another three (a second group of) semiconductor switching elements 2c connected to each other in parallel in a unit of block 2e (block unit). It is noted that in the fifth preferred embodiment, the unit of block 2e is a unit of an insulating substrate (not illustrated) on which the six semiconductor switching elements 2c are mounted.

In the fifth preferred embodiment, the first group of semiconductor switching elements 2c and the second group of semiconductor switching elements 2c constitute the upper arm and the lower arm between the first connection points 2a and the second connection points 2b.

The power module according to the fifth preferred embodiment achieves the same advantages as those in the first preferred embodiment, although the power element 2 is a large-electric-power element including a plurality of chips connected to each other in parallel. In particular, the power element 2 in the fifth preferred embodiment is configured such that, for instance, a chip in the left end of FIG. 6 and a chip in the right end of FIG. 6 are spaced from each other by a relatively large distance. The surge voltage is thus hard to be reduced sufficiently. Hence, the advantage described in the first preferred embodiment (i.e., the reduction of the surge voltage) is effective.

In the fifth preferred embodiment, the block unit is the unit of the insulating substrate on which the chips are mounted. Thus, differences between the insulating substrates are reduced with respect to the advantage, i.e., reduction of the surge voltage.

Six Preferred Embodiment

Figure 7:
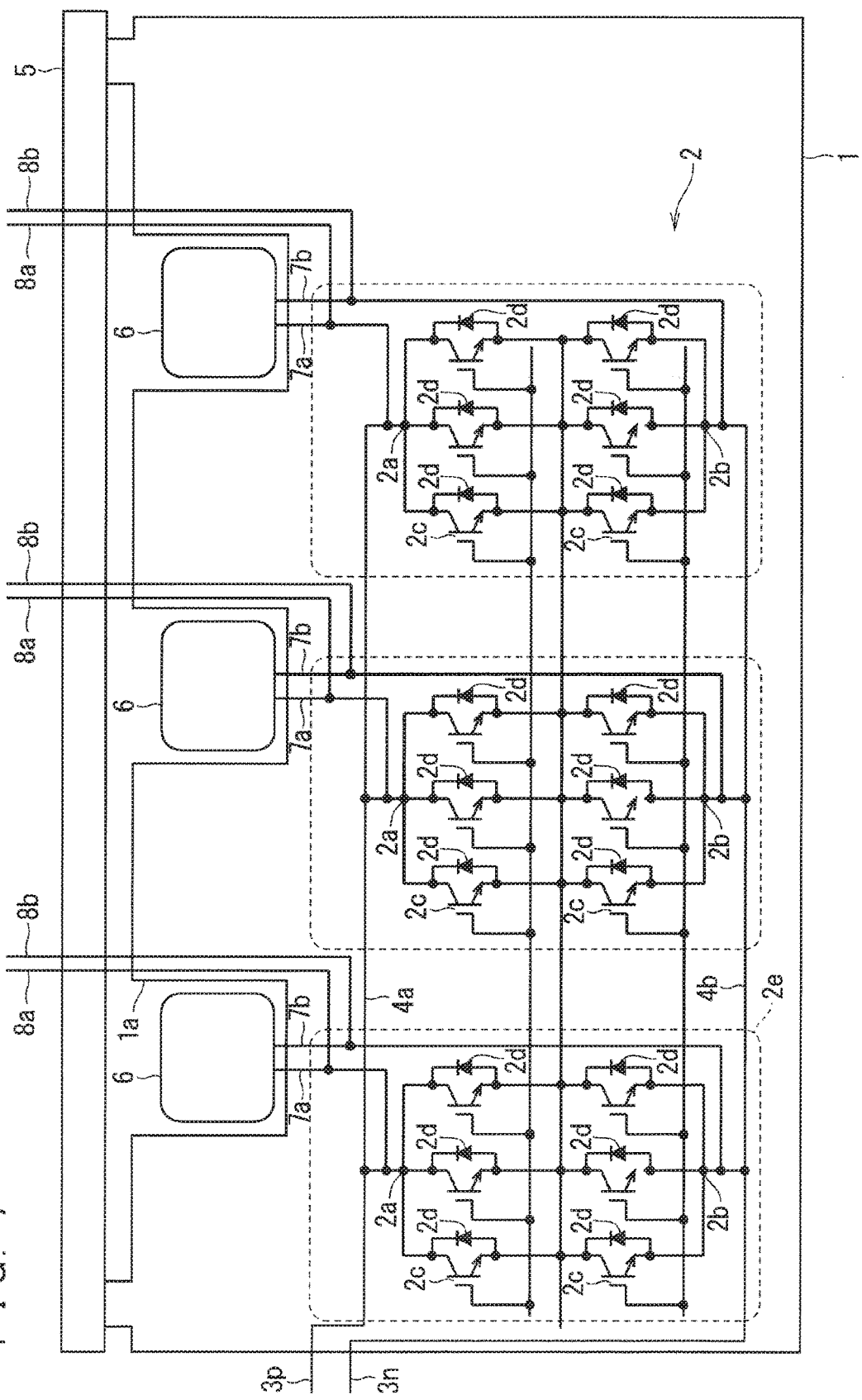
FIG. 7 is a cross-sectional view illustrating a configuration of a power module according to a sixth preferred embodiment.

FIG. 7 is a cross-sectional view illustrating a configuration of a power module according to a sixth preferred embodiment. Among components described in the sixth preferred embodiment, components that are the same as or similar to those of the power modules in the third and fifth preferred embodiments are denoted by the same reference signs. The following mainly describes different components than those of the power modules in the third and fifth preferred embodiments.

The power module according to the six preferred embodiment includes the fifth leads 8a and sixth leads 8b, which are the same as those in the third preferred embodiment (FIG. 4), in addition the components in the fifth preferred embodiment (FIG. 6).

The power module according to the six preferred embodiment achieves the same advantages as those in the fifth preferred embodiment. Further, in the sixth preferred embodiment, the fifth leads 8a and the sixth leads 8b enable the surge voltage in the individual arms to be monitored like in the third preferred embodiment. This facilitates checking whether the surge voltage in the individual arms is reduced for certain.

Seventh Preferred Embodiment

Figure 8:
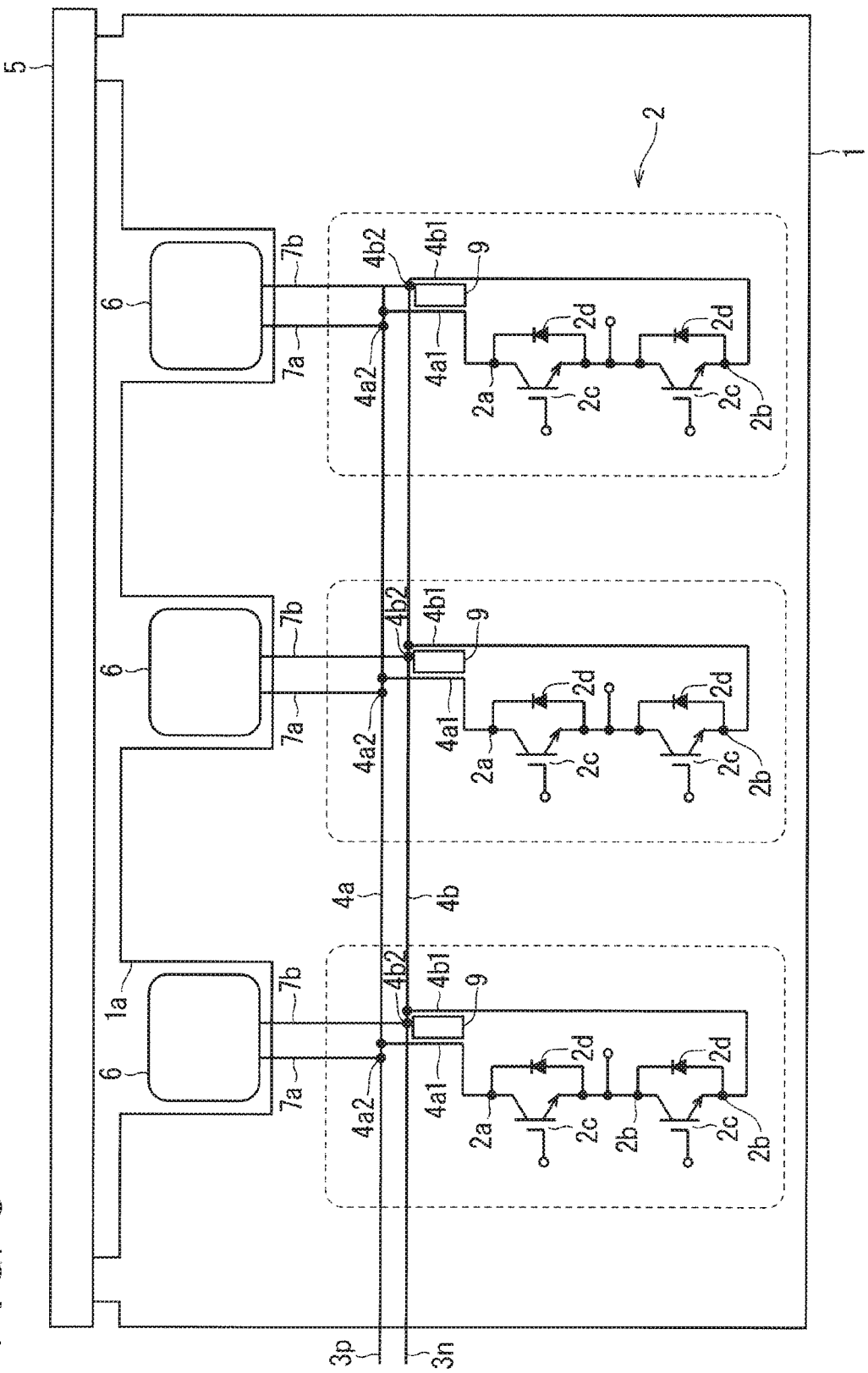
FIG. 8 is a cross-sectional view illustrating a configuration of a power module according to a seventh preferred embodiment.

FIG. 8 is a cross-sectional view illustrating a configuration of a power module according to a seventh preferred embodiment. Among components described in seventh preferred embodiment, components that are the same as or similar to those of the power modules in the first preferred embodiment are denoted by the same reference signs. The following mainly describes different components than those of the power module in the first preferred embodiment.

The power module according to the seventh preferred embodiment includes dielectric layers 9 in addition to the components in the first preferred embodiment. Here, in the seventh preferred embodiment, the first lead 4a and the second lead 4b are adjacent to each other. Moreover, the dielectric layers 9 are disposed between the first lead 4a and the second lead 4b.

In the example of FIG. 8, the first lead 4a has first portions 4a1, and the second lead 4b has second portions 4b1. Each first portion 4a1 and each second portion 4b1 are adjacent to each other. Here, each first portion 4a1 is between a corresponding third connection point 4a2 and the corresponding first connection point 2a, where the first lead 4a and the corresponding third lead 7a are connected together at the third connection point 4a2. Likewise, each second portion 4b1 is between a corresponding fourth connection point 4b2 and the corresponding second connection point 2b, where the second lead 4b and the corresponding fourth lead 7b are connected together at the fourth connection point 4b2. Moreover, the dielectric layers 9 are disposed between the first portions 4a1 of the first lead 4a and the second portions 4b1 of the second lead 4b.

The power module according to the seventh preferred embodiment achieves the same advantages as those in the first preferred embodiment. Further, in the seventh preferred embodiment, the first lead 4a and the second lead 4b are adjacent to each other. In such a configuration, the first lead 4a and the second lead 4b enable a capacitor to be substantially located to be adjacent to the power element 2. As a result, this yields an advantage, such as the snubber capacitors 6 having a small capacitance, or the surge voltage being further reduced or eliminated.

In the seventh preferred embodiment, the dielectric layers 9 enable the capacitor, which is adjacent to the power element 2, to have a large capacitance. This yields the advantage, such as the snubber capacitors 6 having a small capacitance, or the surge voltage being further reduced or eliminated.

It is noted that each third lead 7a and each fourth lead 7b may be adjacent to each other in the seventh preferred embodiment. It is also noted that a dielectric layer may be disposed between the third lead 7a and the fourth lead 7b. In such a configuration, the power module achieves the same advantage as those previously described. In the above description, the seventh preferred embodiment is applied to, but not limited to the first preferred embodiment. For instance, the seventh preferred embodiment may be applied to the second and fifth preferred embodiments.

Eighth Preferred Embodiment

Figure 9:
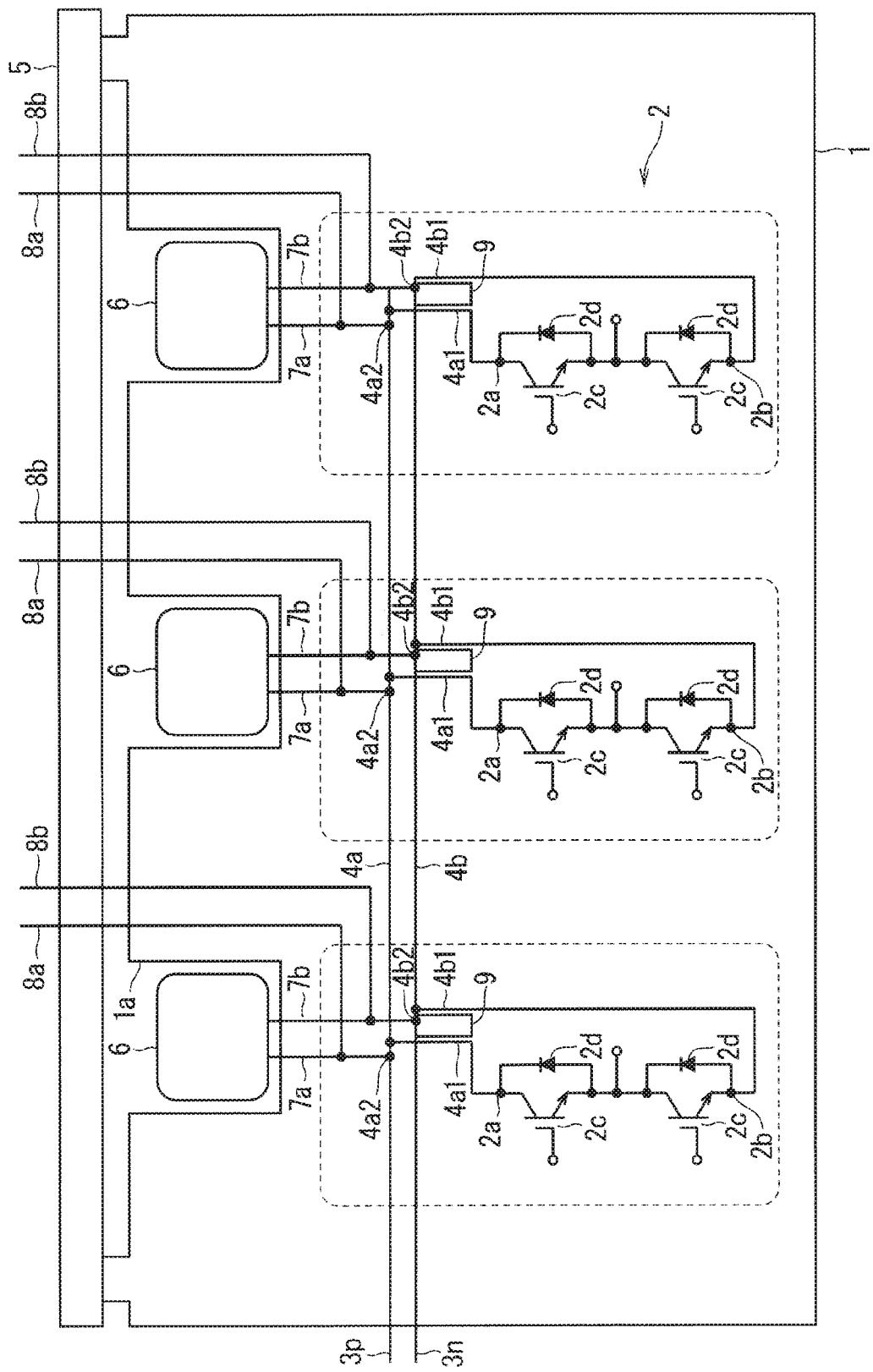
FIG. 9 is a cross-sectional illustrating a configuration of a power module according to an eighth preferred embodiment.

FIG. 9 is a cross-sectional view illustrating a configuration of a power module according to an eighth preferred embodiment. Among components described in the eighth preferred embodiment, components that are the same as or similar to those of the power modules in the third and seventh preferred embodiments are denoted by the same reference signs. The following mainly describes different components than those of the power modules in the third and seventh preferred embodiments.

The power module according to the eighth preferred embodiment includes the fifth leads 8a and the sixth leads 8b, which are the same as those in the third preferred embodiment (FIG. 4), in addition to the components in the seventh preferred embodiment (FIG. 8).

Like in the third preferred embodiment, the power module according to the eight preferred embodiment is configured such that the fifth leads 8a and the sixth leads 8b enable the surge voltage of the individual arms to be monitored. This facilitates checking whether the surge voltage of the individual arms is reduced for certain. Further, like in the seventh preferred embodiment, the power module according to the eighth preferred embodiment has an advantage, such as the snubber capacitors 6 having a small capacitance, or the surge voltage being further reduced or eliminated.

Ninth Preferred Embodiment

Figure 10:
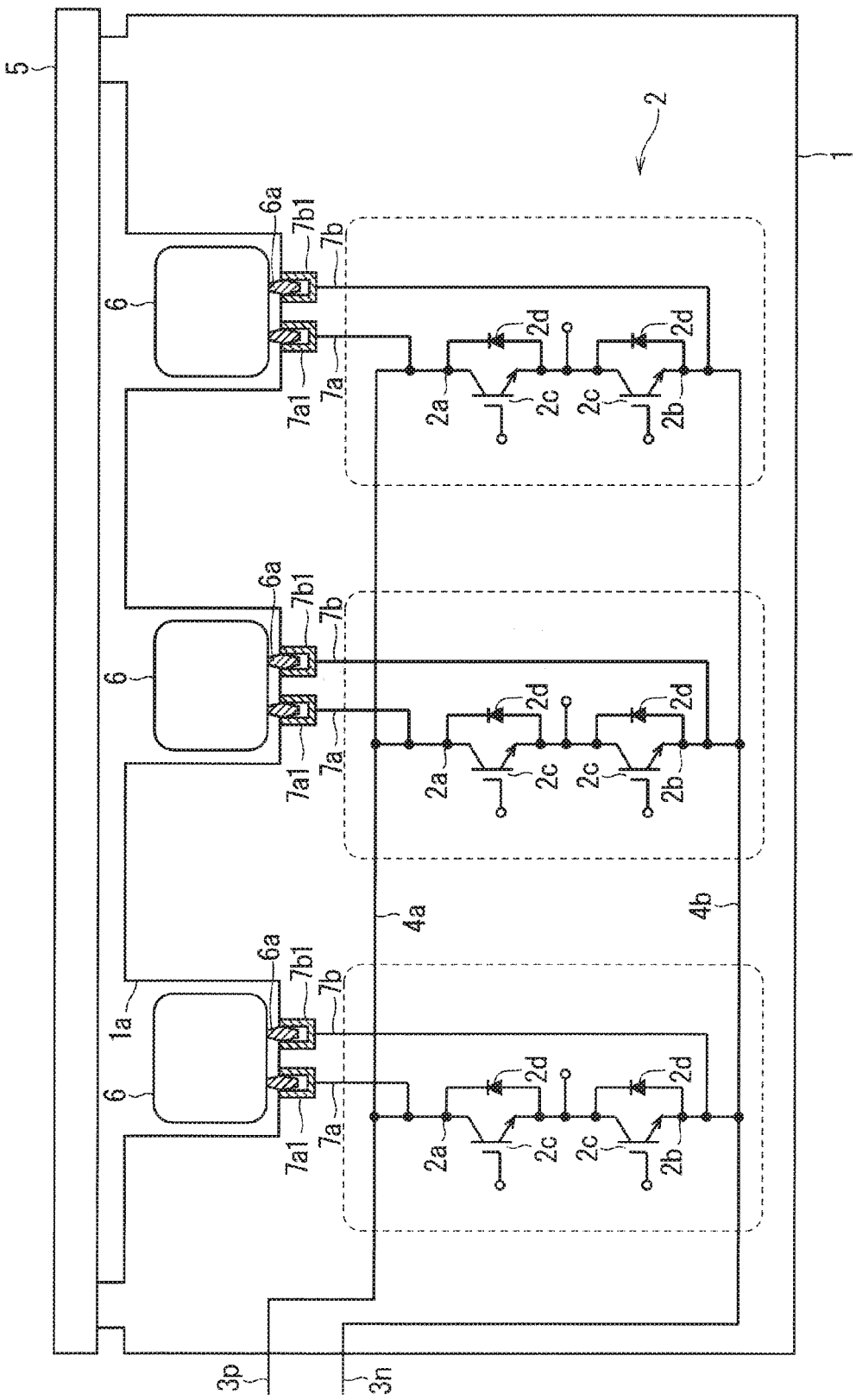
FIG. 10 is a cross-sectional view illustrating a configuration of a power module according to a ninth preferred embodiment.

FIG. 10 is a cross-sectional view illustrating a configuration of a power module according to a ninth preferred embodiment. Among components described in the ninth preferred embodiment, components that are the same as or similar to those of the power module in the first preferred embodiment are denoted by the same reference signs. The following mainly describes different components those of the power module in the first preferred embodiment.

In the ninth preferred embodiment, each third lead 7a has the other end provided with a corresponding socket 7a1 (female). A terminal 6a (male) of the corresponding snubber capacitor 6 is attachable to and detachable from the corresponding socket 7a1. Moreover, each fourth lead 7b has the other end provided with a corresponding socket 7b1 (female). Another terminal 6a (male) of the snubber capacitor 6 is attachable to and detachable from the corresponding socket 7b1.

The power module according to the ninth preferred embodiment is configured such that the terminals 6a of the snubber capacitors 6 are inserted into the respective sockets 7a1 and sockets 7b1, so that the snubber capacitors 6 are connected to the third leads 7a and the fourth leads 7b. Consequently, this facilitates the replacement of the snubber capacitors 6 without through solder, thus providing an easy-to-use power module.

In the above description, the ninth preferred embodiment is applied to, but not limited to the first preferred embodiment. For instance, the ninth preferred embodiment may be applied to the second to eighth preferred embodiments.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A power module comprising:
a package;
a plurality of power elements disposed within said package, each of said power elements comprising a plurality of semiconductor switching elements constituting an upper arm and a lower arm between a first connection point and a second connection point;
a positive terminal configured to guide said first connection points of said power elements outside said package through a first lead;
a negative terminal configured to guide said second connection points of said power elements outside said package through a second lead;
a plurality of third leads each having a first end electrically connected to a respective one of said first connection points, and a second end exposed from said package, said third leads each being shorter than said first lead; and
a plurality of fourth leads having a first end electrically connected to a respective one of said second connection points, and a second end exposed from said package, said fourth leads each being shorter than said second lead, wherein
each of said plurality of third leads and a respective one of said plurality of fourth leads connects to a respective snubber capacitor that is attachable to and detachable from each of said second ends of said third leads and said fourth leads.

2. A power module comprising:
a package;
a power element disposed within said package, said power element comprising a plurality of semiconductor switching elements constituting an upper arm and a lower arm between a first connection point and a second connection point;
a positive terminal configured to guide said first connection point of said power element outside said package through a first lead;
a negative terminal configured to guide said second connection point of said power element outside said package through a second lead;
a third lead having a first end electrically connected to said first connection point, and a second end exposed from said package, said third lead being shorter than said first lead; and
a fourth lead having a first end electrically connected to said second connection point, and a second end exposed from said package, said fourth lead being shorter than said second lead, wherein
a snubber capacitor is attachable to and detachable from said second ends of said third lead and said fourth lead, and
said power element comprises a wide bandgap semiconductor.

3. A power module comprising:
a package;
a power element disposed within said package, said power element comprising a plurality of semiconductor switching elements constituting an upper arm and a lower arm between a first connection point and a second connection point;
a positive terminal configured to guide said first connection point of said power element outside said package through a first lead;
a negative terminal configured to guide said second connection point of said power element outside said package through a second lead;
a third lead having a first end electrically connected to said first connection point, and a second end exposed from said package, said third lead being shorter than said first lead; and
a fourth lead having a first end electrically connected to said second connection point, and a second end exposed from said package, said fourth lead being shorter than said second lead, wherein
a snubber capacitor is attachable to and detachable from said second ends of said third lead and said fourth lead,
said power element comprises, in a block unit, a first group of said plurality of semiconductor switching elements connected to each other in parallel, and a second group of said plurality of semiconductor switching elements connected to each other in parallel, and
said first group of said plurality of semiconductor switching elements and said second group of said plurality of semiconductor switching elements constitute an upper arm and a lower arm between said first connection point and said second connection point.

4. The power module according to claim 3, wherein said block unit is a unit of an insulating substrate on which said plurality of semiconductor switching elements are mounted.

5. The power module according to claim 2, wherein said upper arm and said lower arm, which comprise said plurality of semiconductor switching elements, are provided for individual phases.

6. The power module according to claim 2, further comprising:
a fifth lead having a first end connected to said third lead, and a second end exposed from said package; and
a sixth lead having a first end connected to said fourth lead, and a second end exposed from said package.

7. The power module according to claim 2, wherein said first lead and said second lead are adjacent to each other.

8. The power module according to claim 7, further comprising a dielectric layer disposed between said first lead and said second lead.

9. The power module according to claim 2, wherein
said third lead and said fourth lead include sockets in said second ends of said third lead and said fourth lead, and
terminals of said snubber capacitor are attachable to and detachable from said sockets.

10. The power module according to claim 2, wherein said package has a surface provided with a recess in which said snubber capacitor is accommodated when said snubber capacitor is attached to said second ends of said third lead and said fourth lead.

11. The power module according to claim 2, wherein said package has a surface provided with a protrusion protruding in parallel with said snubber capacitor when said snubber capacitor is attached to said second ends of said third lead and said fourth lead.

* * * * *